United States Patent
Weber et al.

(10) Patent No.: US 10,708,980 B2
(45) Date of Patent: Jul. 7, 2020

(54) RADIATOR MODULE AND USE OF THE RADIATOR MODULE

(71) Applicant: Heraeus Noblelight GmbH, Hanau (DE)

(72) Inventors: Jürgen Weber, Kleinostheim (DE); Bernhard Weber, Fürstenfeldbruck (DE); Frank Diehl, Bad Homburg (DE)

(73) Assignee: Heraeus Noblelight GmbH, Hanau (DE)

( * ) Notice: Subject to any disclaimer, the term of this patent is extended or adjusted under 35 U.S.C. 154(b) by 352 days.

(21) Appl. No.: 15/753,275

(22) PCT Filed: Jul. 20, 2016

(86) PCT No.: PCT/EP2016/067231
§ 371 (c)(1),
(2) Date: Feb. 17, 2018

(87) PCT Pub. No.: WO2017/029052
PCT Pub. Date: Feb. 23, 2017

(65) Prior Publication Data
US 2018/0242399 A1 Aug. 23, 2018

(30) Foreign Application Priority Data
Aug. 19, 2015 (DE) .................. 10 2015 113 766

(51) Int. Cl.
*H01L 21/67* (2006.01)
*H05B 3/00* (2006.01)
*H05B 3/40* (2006.01)

(52) U.S. Cl.
CPC ...... *H05B 3/0033* (2013.01); *H01L 21/67115* (2013.01); *H05B 3/40* (2013.01)

(58) Field of Classification Search
CPC ......... H01L 21/67115; H01L 21/67109; H01L 21/67173; H01L 21/67178; H01L 21/6719; H05B 3/0033; H05B 3/40
(Continued)

(56) References Cited

U.S. PATENT DOCUMENTS 3,627,989 A    12/1971  Heidler et al.
6,421,503 B2 *  7/2002  Grob .................... H05B 3/0066
                                                      219/477

(Continued)

FOREIGN PATENT DOCUMENTS

DE    102011012363      8/2012
DE    102013105959     12/2014
(Continued)

OTHER PUBLICATIONS

Office Action dated Mar. 19, 2019 from corresponding Japanese Patent Application No. 2018-508636.
(Continued)

*Primary Examiner* — Jennifer C Chiang
(74) *Attorney, Agent, or Firm* — Stradley Ronon Stevens & Young, LLP

(57) ABSTRACT

A radiator module is provided including: a first infrared radiator including a first radiator tube arranged in a radiator plane; and a second infrared radiator including a second radiator tube arranged in the radiator plane. A cladding tube is arranged between the first radiator tube and the second radiator tube. Each of the first radiator tube, the second radiator tube, and the cladding tube is provided with a reflective coating.

20 Claims, 4 Drawing Sheets

(58) Field of Classification Search
USPC .......................................................... 219/553
See application file for complete search history.

(56) References Cited

U.S. PATENT DOCUMENTS

| | | | |
|---|---|---|---|
| 6,577,816 B2* | 6/2003 | Grob ................... | H05B 3/0066 |
| | | | 219/477 |
| 9,076,635 B2* | 7/2015 | Gross ................ | H01L 21/67115 |
| 2002/0148824 A1 | 10/2002 | Hauf et al. | |
| 2003/0094446 A1 | 5/2003 | Tay et al. | |
| 2008/0212169 A1 | 9/2008 | Groenen et al. | |
| 2013/0216967 A1 | 8/2013 | Fürfanger et al. | |
| 2015/0010294 A1 | 1/2015 | Weber et al. | |
| 2016/0116211 A1 | 4/2016 | Weber et al. | |

FOREIGN PATENT DOCUMENTS

| | | |
|---|---|---|
| JP | 5917587 | 1/1984 |
| JP | 6465790 | 3/1989 |
| JP | 2004119942 | 4/2004 |
| JP | 2004172103 | 6/2004 |
| JP | 2005503003 | 1/2005 |
| JP | 2008541366 | 11/2008 |
| JP | 2013546157 | 12/2013 |
| JP | 2015513058 | 4/2015 |
| WO | 2012025607 | 3/2012 |

OTHER PUBLICATIONS

International Search Report for International Patent Application No. PCT/EP2016/067231 dated Sep. 7, 2016.
Office Action for German Patent Application No. 102015113766.6 dated Apr. 20, 2016.

* cited by examiner

RADIATOR MODULE AND USE OF THE RADIATOR MODULE

CROSS REFERENCE TO RELATED APPLICATIONS

This application is a U.S. National Phase filing of international patent application number PCT/EP2016/067231 filed Jul. 20, 2016 that claims the priority of German patent application number 102015113766.6 filed Aug. 19, 2015. The disclosures of these applications are hereby incorporated by reference in their entirety.

FIELD

The invention relates to a radiator module comprising a first infrared radiator including a first radiator tube arranged in a radiator plane, and a second infrared radiator including a second radiator tube arranged in the radiator plane, and use of the radiator module.

BACKGROUND

Infrared radiator modules having multiple infrared radiators arranged in a radiator plane are known, and are often used as panel radiators.

Panel radiators have a front side and a rear side. Often, the front side of the panel radiator faces a process space such that only the radiation emitted towards the front side of the panel radiator is available as useful radiation in this type of radiator module. It is therefore desirable to have the maximum possible portion of the radiation emitted by the infrared radiators directed at the front side of the panel radiator since only this portion can be used for irradiation of a substrate.

As a general rule, infrared radiators emit undirected radiation. In order to provide the maximum possible fraction of the radiation emitted by the infrared radiators for substrate irradiation and simultaneously attain a high irradiation intensity in the process space, the infrared radiators usually have a common reflector allocated to them that extends at a predetermined distance from the infrared radiators.

The reflector reflects the portion of the radiation that reaches the rear side of the panel radiator and deflects the portion of the radiation in the direction of the substrate.

An irradiation apparatus including a radiator module of this type is known, for example, from DE 10 2013 105 959 A1. The radiator module includes a housing, in which multiple twin-tube infrared radiators are arranged. Moreover, the housing is provided with a reflector on its inside such that a maximum possible fraction of the emitted infrared radiation is coupled onto the substrate. Known radiator modules therefore usually include a rear space that is bordered by the infrared radiators on one side and the reflector on the other side.

The use of a separate reflector is disadvantageous though in that the reflector does not always reflect radiation right at the substrate, but rather, reflected radiation is also incident on neighbouring infrared radiators and can be reflected again there. This is usually observed to be associated with radiation losses that can impair the radiation efficiency of the radiator module. This problem is particularly evident if high irradiation intensities are to be attained with the radiator module. Radiator modules that are designed for high irradiation intensities are usually made to have a compact design, in which neighbouring infrared radiators are disposed at a minimum distance from each other. However, the probability of undesired reflection or absorption of radiation on the infrared radiators increases with decreasing distance of the infrared radiators. This impairs the energy efficiency of the radiator module.

SUMMARY

According to an exemplary embodiment of the invention, a radiator module is provided. The radiator module includes: a first infrared radiator including a first radiator tube arranged in a radiator plane; a second infrared radiator including a second radiator tube arranged in the radiator plane; and a cladding tube arranged between the first radiator tube and the second radiator tube. The first radiator tube, the second radiator tube, and the cladding tube each are provided with a reflective coating.

According to another exemplary embodiment of the invention, a method of using a radiator module is provided. The method includes the steps of: (a) providing a radiator module including (i) a first infrared radiator including a first radiator tube arranged in a radiator plane, (ii) a second infrared radiator including a second radiator tube arranged in the radiator plane, and (iii) a cladding tube arranged between the first radiator tube and the second radiator tube, wherein the first radiator tube, the second radiator tube, and the cladding tube each are provided with a reflective coating; and (b) heating, using the radiator module, at least one of a metal sheet, a substrate for printed electronics, and ink.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

Figure 1:
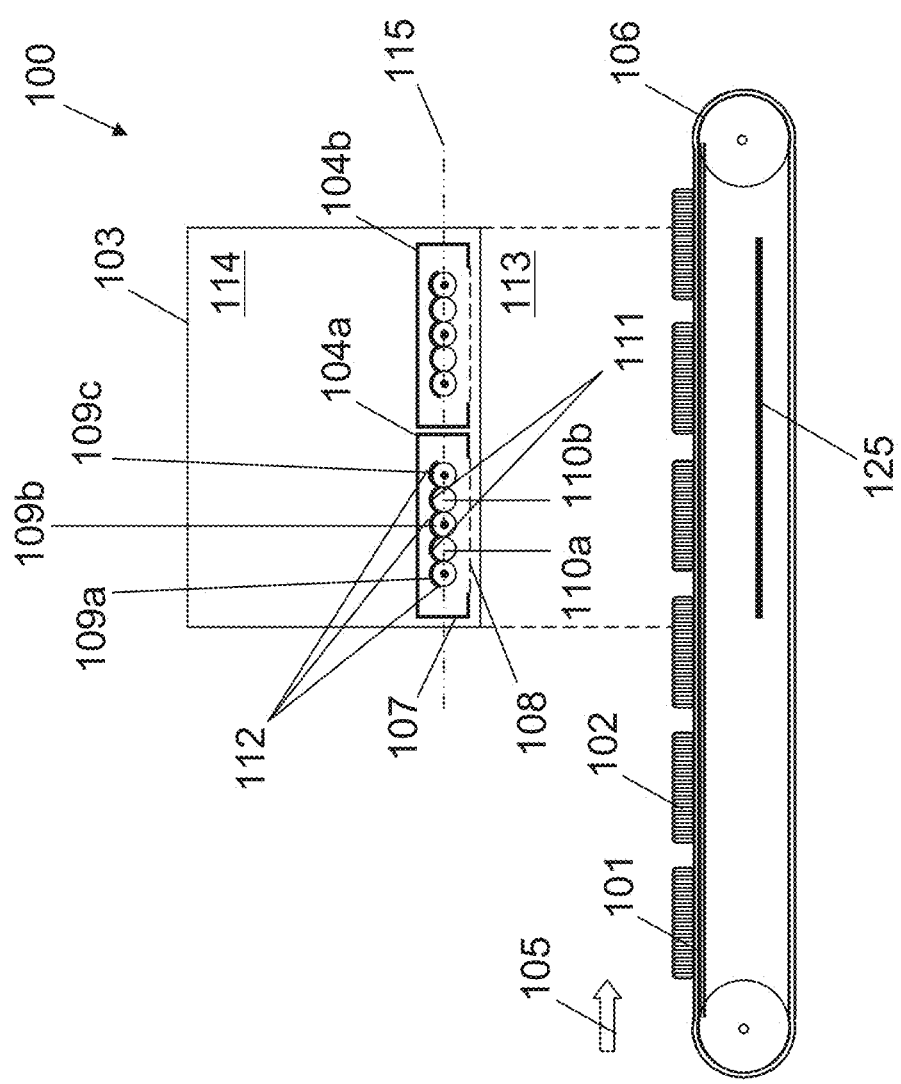
FIG. 1 is a cross-sectional view of an irradiation apparatus including two radiator modules according to an exemplary embodiment of the invention.

Aspects of the invention are based on an object to devise a radiator module that is designed for high irradiation intensities and high energy efficiency. Additional aspects of the invention are based on the object to specify a use of the radiator module.

Radiator modules according to exemplary embodiments of the invention may be suitable for irradiation of a substrate having a reflective surface, for example, for irradiation of a substrate with a metallic surface. Moreover, irradiation modules according to the invention may be used for irradiation of transparent substrates, in particular in irradiation facilities, in which a reflector reflects the radiation portions that pass through the substrate back in the direction of the substrate, where the reflector may be arranged underneath the transparent substrate in order to increase the irradiation efficiency.

A reflective surface is a surface which reflects radiation that is incident on it, completely or partially. A reflective surface may include non-reflective sub-surfaces. Reflective surfaces typically have a high reflectance of at least, for example, 50%. The reflectance may be defined as the ratio of reflected energy and incident energy and can be determined, for example, as follows:

$$\rho = P_r/P_0$$

whereby $P_r$ is the power of the reflected radiation, and $P_0$ is the power of the incident radiation.

Radiator modules according to the invention may be designed to attain high irradiation intensities; they can be used, for example, for tin-plating copper sheets, for heating of substrates such as bands or sheet metal, for producing printed electronics or for drying ink.

Referring to the radiator module, the object specified above may be solved according to the invention in that a cladding tube is arranged between the first radiator tube and the second radiator tube, and in that the first radiator tube, the second radiator tube, and the cladding tube each are provided with a reflective coating.

Especially the irradiation of reflective substrates is associated with a problem in that not all of the radiation that is incident on the substrate is absorbed by the substrate. Rather, major portions of the radiation are often reflected by the substrate itself and are returned in the direction of the radiator module. As a consequence, only part of the radiation directed at the substrate actually is effective radiation.

Aspects of the invention are based on finding that the energy efficiency of a radiator module can be increased if the portion of radiation reflected by the substrate can also be returned directly onto the substrate. For this purpose, exemplary embodiments of the invention propose two modifications as compared to the prior art, of which one relates to providing an additional cladding tube and the other relates to providing a reflective coating on the infrared radiators and the cladding tube.

It is common to arrange infrared radiators next to each other in panel radiators. But the panel radiators are exposed to high thermal stress under operating conditions, in particular since the neighbouring infrared radiators heat each other up. Therefore, a minimum distance must be kept in the arrangement of the infrared radiators as a matter of rule. Therefore, there usually is an intervening space between neighbouring infrared radiators through which the radiation reflected by the substrate can reach the rear space of the radiator module. Often, the radiation is reflected multiple times in the rear space, whereby significant portions of said radiation are absorbed.

The energy efficiency of the radiator module can therefore be increased by minimizing the ingress of radiation into the rear space. It is therefore proposed, according to exemplary embodiments of the invention, to arrange at least one cladding tube between the first and the second infrared radiator. A cladding tube is an elongated hollow body, for example, a cylinder-shaped tube made of quartz glass. The temperature of the cladding tube is determined essentially by the temperature of its environment. Accordingly, in contrast to the heated radiator tube of the second infrared radiator, it can be positioned more closely to the radiator tube of the first infrared radiator. By this means, initially the intervening space between neighbouring infrared radiators is filled and reduced. If the cladding tube also is capable of reflecting radiation, just the presence of the cladding tube contributes to increased ingress of radiation into the rear space.

Since, in addition, the radiator tube of the first infrared radiator, the radiator tube of the second infrared radiator and the cladding tube are provided with a reflective coating, ingress of infrared radiation into the rear space is very difficult to counteract effectively. This applies equally to the radiation emitted by the infrared radiators, which—in as far as it is directed towards the rear space—is reflected right at the reflective coating of the radiator tube, as well as for the radiation reflected by the substrate, which is also reflected back onto the substrate on the reflective coating of the cladding tube, the first infrared radiator, or the second infrared radiator.

A coating of the first or second radiator tube and/or cladding tube is easy to manufacture; moreover, it requires little space and thus contributes to a compact radiator module.

In a preferred embodiment of the radiator module according to the invention, the cladding tube is provided with a diffusely scattering reflective coating.

Mainly radiation reflected by the substrate is incident on the reflective coating of the cladding tube. An incident beam of light is scattered in many different directions on a diffusely scattering surface (scattered light). A diffusely scattering coating therefore contributes to an undirected homogeneous radiation distribution. Scattered light is suitable, in particular, for generation of homogeneous irradiation intensities since peaks in the irradiation intensity are attenuated and the difference between minimum and maximum irradiation intensity is reduced.

It has been proven to be expedient for the first radiator tube and/or the second radiator tube to be provided with a directed-reflective coating.

An essential portion of the radiation reflected by the coating of the first and/or second radiator tube is radiation that is emitted directly by the corresponding infrared radiator. A directed-reflective coating is advantageous in that a radiation field, which can be adapted to the substrate to be irradiated by appropriate selection of the coating and its shape, can be generated from this radiation by reflection. Specifically, it is possible to focus the reflected radiation onto a certain area of the substrate. By this means, it becomes feasible to adapt the irradiation distribution as a function of the substrate shape. Moreover, it is feasible to appropriately bundle the radiation from the first and/or second radiator tube such that an irradiation field of high irradiation intensity is attained.

Preferably, the reflective coating of the first radiator tube, second radiator tube and/or cladding tube is manufactured from gold, opaque quartz glass or ceramics.

Reflective coatings made of gold, opaque quartz glass or ceramics are characterized by their good reflection properties and are easy to manufacture. A reflective gold coating comprises high reflectance; it can be used, in particular, for operating temperatures up to 600° C. A reflector made of opaque quartz glass can also be used at high operating temperatures above 600° C., namely up to 1000° C.; moreover, it exhibits good chemical inertness and can be used in high-performance radiator modules whose total power per surface area exceeds 100 kW/m². It has proven to be advantageous for the reflective coating to be manufactured from a ceramic material containing aluminium oxide or titanium dioxide. Coatings of this type show good thermal resistance and are easy to apply onto the corresponding radiator tube and/or cladding tube in a spray process.

It is time-proven to provide the first and second radiator tube with a reflective coating made of gold and the cladding tube with a coating made of opaque quartz glass.

The largest portion of effective radiation is radiation that was emitted by one of the infrared radiators in the direction of the substrate or that was reflected in the direction of the substrate on the coating of the first and/or a second radiator tube. A gold reflector facilitates targeted, directed reflection of the radiation onto the substrate. If the first and second radiator tube are provided with a coating made of gold, the size of the irradiation field and the intensity distribution in the irradiation field can be predetermined.

It has proven to be expedient to have the radiation reflected directly by the substrate be guided back onto the substrate as homogeneously as possible. By this means, the radiation reflected by the substrate homogeneously increases the irradiation intensity in the irradiation field, whereby the size and intensity distribution of the irradiation field selected previously by means of the type and shape of the gold reflectors is essentially maintained. By this means, the radiation field can be adapted and adjusted easily.

In a preferred embodiment of the radiator module, the reflective coating of the first radiator tube, second radiator tube and/or cladding tube is applied to a circumferential section of the corresponding outer jacket of the tube.

A strip-shaped, reflective coating of this type extends in a longitudinal direction of the corresponding radiator tube and/or cladding tube. Such a coating is easy to apply in an immersion process or spray process.

In another exemplary embodiment of the radiator module, the first radiator tube, the second radiator tube, and the cladding tube each include a side facing the process space and a side facing away from the process space, whereby the reflective coating is applied to the corresponding side of the first and/or second radiator tubes facing away from the process space, and is applied to the side of the cladding tube facing the process space.

Referring to the first and/or second radiator tube, a reflective coating applied to the side facing away from the process space contributes to making it possible that the emitted radiation can be bundled, at least in part, due to the curvature of the tube, and can thus be guided onto the substrate in a targeted manner.

The reflective coating of the cladding tube can be applied either on the side of the cladding tube facing the process space or on the side facing away from the process space. A reflective coating being applied to the side of the cladding tube facing the process space is advantageous in that radiation reflected by the substrate is incident on the reflective coating directly and is reflected there without first having to pass through the wall of the cladding tube. By this means, on the one hand, absorption losses at the cladding tube wall are reduced. On the other hand, it prevents the radiation incident on the cladding tube from being coupled into the cladding tube. If portions of radiation are incident on the cladding tube at a suitable angle, the cladding tube can act as an optical waveguide by means of which the radiation coupled into the tube can be transported all the way to the ends of the radiator tube by means of total reflection. This portion of the radiation cannot be utilized for irradiation of the substrate. Accordingly, the coupling of radiation into the cladding tube usually is associated with radiation losses and a lower energy efficiency.

It has proven to be advantageous to have the cladding tube include an external jacket, and to have a section of the external jacket of the cladding tube be fully jacketed by a reflective coating.

The external jacket of the cladding tube can be provided fully or partly with the reflective coating. A cladding tube with a fully coated external jacket is easy to manufacture, for example, by immersion in a coating agent. Moreover, it contributes to the radiator module having good energy efficiency since the ingress of radiation into the cladding tube is made more difficult such that lower losses due to the absorption of radiation at the cladding tube are observed.

Advantageously, the reflective coatings of the first radiator tube, second radiator tube, and cladding tube are connected to each other.

Having the coatings of first radiator tube, second radiator tube and cladding tube be connected contributes to minimizing the intervening spaces between these components such that any ingress of radiation into the rear space of the radiator module can be reduced effectively. Preferably, the intervening spaces are fully closed by the coating.

It has proven to be expedient to have the shortest distance of the first radiator tube to the cladding tube, and/or the shortest distance of the second radiator tube to the cladding tube, be in the range of 0.5 mm to 2 mm.

A short distance in this range contributes to increasing the energy efficiency of the radiator module. A distance of less than 0.5 mm can be realized only with much effort due to the temperature-dependent expansion of the materials of radiator tube and cladding tube. A distance of more than 2 mm is observed to be associated with only a minor increase in the energy efficiency.

Referring to the use of the radiator module, the radiator module may be used for heating of metal sheets, for heating of substrates for printed electronics or for drying of ink or for coating of metal sheets, in particular for tin-plating of copper sheet.

Referring now to the drawings, FIG. 1 shows an irradiation apparatus, which, in toto, has reference number 100 assigned to it. The radiation apparatus 100 is used for drying of a glass substrate 101 that is provided with a wet lacquer layer 102.

Initially, the glass substrate 101 is provided with a wet lacquer layer 102, preferably by spraying of the layer (not shown). In order to dry the wet lacquer layer 102, the glass substrate 101 is fed to the irradiation apparatus 100, where it is subjected to a temperature treatment. A transport apparatus 106 with a transport belt made of quartz glass is intended for this purpose. The feed direction is indicated by the arrow 105. A reflector 125 is arranged underneath the transport belt 106 and reflects the portion of radiation that is incident on it in the direction of the glass substrate 101. During the heat treatment, the wet lacquer layer 102 is heated beyond the boiling point of a solvent contained in the wet lacquer layer such that the solvent evaporates.

The irradiation apparatus 100 includes an aluminium housing 103, a process space 113, and two radiator modules 104a, 104b arranged in the housing 103, for irradiation of the process space 113. The radiator modules 104a, 104b are structurally identical.

The radiator module 104a includes a module housing 107 made of hot-dip aluminized metal sheet that is provided with an exit opening 108 for infrared radiation. Three structurally identical infrared radiators 109a, 109b, 109c and two structurally identical cladding tubes 110a, 110b are arranged on the inside of the module housing 107. The infrared radiators 109a, 109b, 109c each include a cylinder-shaped radiator tube made of quartz glass that has a longitudinal axis of the radiator tube. The infrared radiators 109a, 109b 109c each are characterized by a nominal power of 4000 W at a nominal operating voltage of 230 V. The external diameter of the corresponding radiator tube is 23 mm and the heated radiator tube length is 700 mm. Moreover, the radiator tubes each include a rear side facing a rear space 114 and, disposed opposite from it, a front side facing the process space 113. A radiator tube coating 112 made of opaque quartz glass (QRC®, Heraeus) is applied to the rear side of each of the radiator tubes.

A cylinder-shaped cladding tube 110a, 110b having a longitudinal axis of the cladding tube is arranged between each of the infrared radiators 109a, 109b, 109c. The cladding tubes 110a, 110b each have an external diameter of 23 mm and a wall thickness of 1.8 mm and a cladding tube length of 700 mm; moreover, they comprise a rear side that faces away from the exit opening 108 of the module housing 107 and a front side that faces the exit opening 108. A radiator tube coating 111 made of opaque quartz glass (QRC®, Heraeus) is applied to the rear side of the cladding tube 110a.

In an alternative embodiment of the radiator module 104a (not shown), the coating made of opaque quartz glass is applied to the front side of the cladding tube 110a.

Infrared radiators 109a, 109b, 109c and cladding tubes 110a, 110b are arranged appropriately such that the longitudinal axes of the radiator tubes and the longitudinal axes of the cladding tube extend within a radiator plane 115.

Moreover, the radiator module 104a is also well-suited for tin-plating of copper sheet. Preferably, the copper sheet is coiled onto a reel (not shown). The method includes the process steps of: providing a first reel that has a non-tin-plated copper sheet coiled onto it, guiding the copper sheet through a tin-containing bath while depositing a tin coating, heat treating the copper sheet provided with the tin coating with infrared radiation to obtain a tin-plated copper sheet, and guiding the tin-plated copper sheet to a second reel that is designed to take up the tin-plated copper sheet.

In this method, the copper sheet is preferably immersed in a tin-containing solution, whereby a tin coating is deposited on the surface of the copper sheet. Preferably, the tin-plating takes place by application of an electrical voltage (galvanic ten-plating) (not shown). By this means, a tin coating with a low coating thickness is obtained. In order to increase the strength of the tin coating, the copper sheet provided with the tin coating is guided to an irradiation apparatus including the radiator module 104a and is subjected to a heat treatment there. In this context, it is time-proven to have the copper sheet guided out of the bath in a guiding direction perpendicular to the surface of the bath and, if the radiator module 104a is arranged perpendicular to the surface of the bath, to also have the radiator tubes of the radiator module 104a arranged appropriately such as to be parallel to the guiding direction.

During the heat treatment, the tin coating is heated beyond the melting point of tin such that a layer of tin-copper alloy is formed at least in the transition zone of tin coating and copper sheet.

Moreover, the module 104a can also be used to change the microstructure of an aluminium sheet. The aluminium sheet is heated to a temperature above 330° C. in this context.

Figure 2:
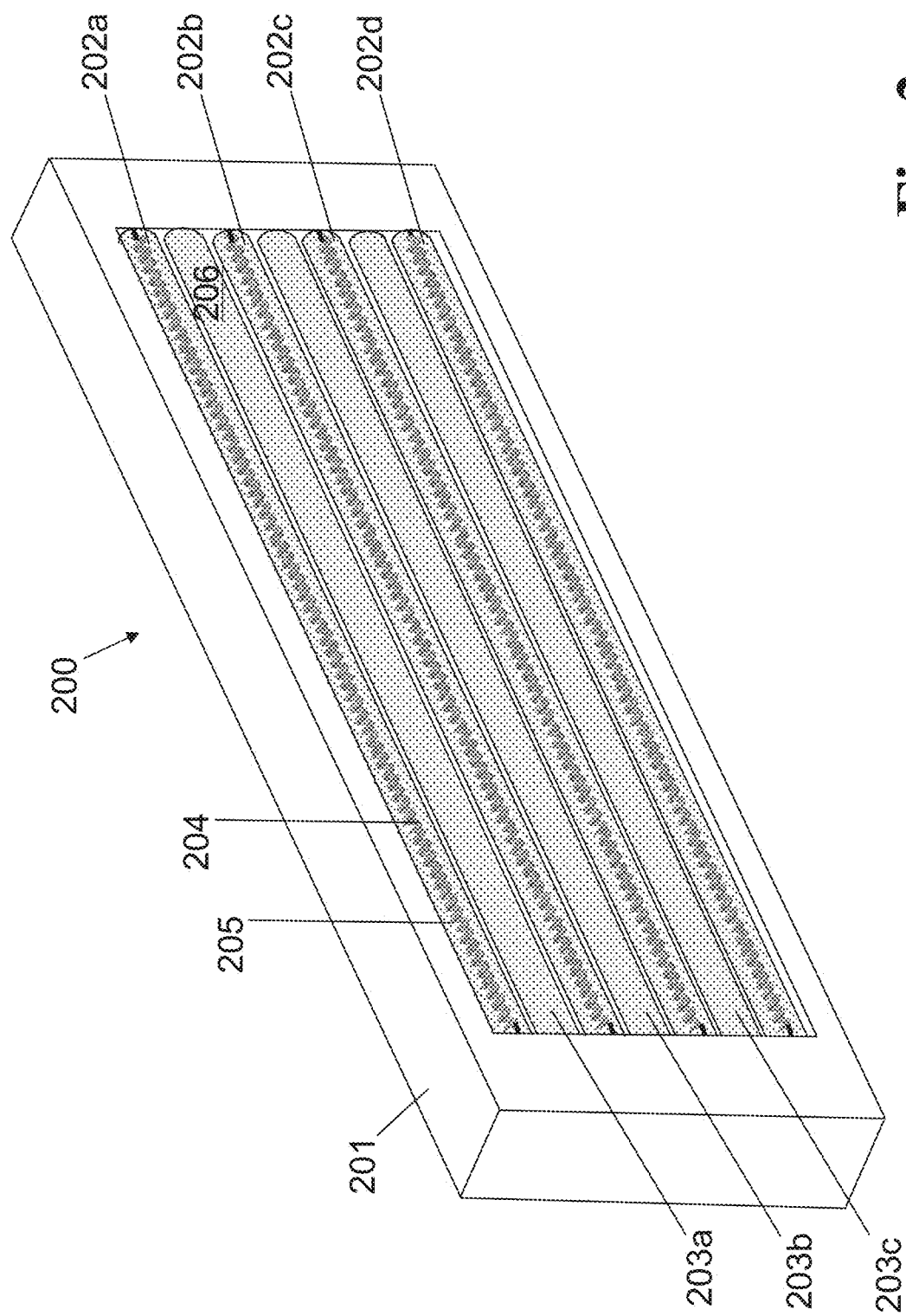
FIG. 2 is a perspective view of a radiator module according to an exemplary embodiment of the invention.

FIG. 2 shows a perspective view of a second embodiment of a radiator module 200 according to the invention, which also can be used in the irradiation apparatus 100 according to FIG. 1.

The radiator module 200 includes a module housing 201 made of stainless steel, in which four infrared radiators 202a, 202b, 202c, 202d and three cladding tubes 203a, 203b, 203c are arranged. The module housing 201 has a front side with an exit opening 206 for infrared radiation and a rear side (not shown) that is disposed to be opposite from the front side; it has a length of 900 mm, a width of 550 mm, and a height of 300 mm.

The infrared radiators 202a, 202b, 202c, 202d are structurally identical. Therefore, only infrared radiator 202a shall be described for exemplary purposes.

Infrared radiator 202a has a cylinder-shaped radiator tube 205 made of quartz glass with a length of 700 mm, an external diameter of 34 mm, and a wall thickness of 2 mm. A coil-shaped heating filament 204 made of tungsten is arranged inside the radiator tube 205. The infrared radiator 202a is characterized by a nominal power of 4,000 W at a nominal current of 17 A.

A reflective coating made of titanium dioxide is applied to each half-side of the surface of the radiator tubes of the infrared radiators 202a, 202b, 202c, 202d. The infrared radiators 202a, 202b, 202c, 202d are arranged appropriately in the radiator module such that the coated half of each of the radiator tubes faces the rear side of the radiator module 200.

The infrared radiators 202a, 202b, 202c, 202d are arranged appropriately inside the module housing 201 such that their longitudinal axes of the radiator tubes extend parallel with respect to each other. The distance between neighbouring infrared radiators (measured from outside of the radiator tube to outside of the radiator tube) is 27 mm.

Cladding tubes 203a, 203b, 203c are arranged appropriately in the intervening spaces between neighbouring infrared radiators 202a, 202b, 202c, 202d such that the corresponding longitudinal axis of the cladding tube extends parallel with respect to the longitudinal axes of the radiator tubes of the infrared radiators 202a, 202b, 202c, 202d. The cladding tubes 203a, 203b, 203c are manufactured from quartz glass; they have a length of 700 mm, an external diameter of 23 mm, and a cladding tube wall thickness of 2 mm. The shortest distance between cladding tube and radiator tube is 2 mm.

A coating made of opaque quartz glass (QRC®, Heraeus) is applied to each half-side of the cladding tubes 203a, 203b, 203c. The coated side of the cladding tubes faces the rear side of the radiator module 200.

Figure 3:
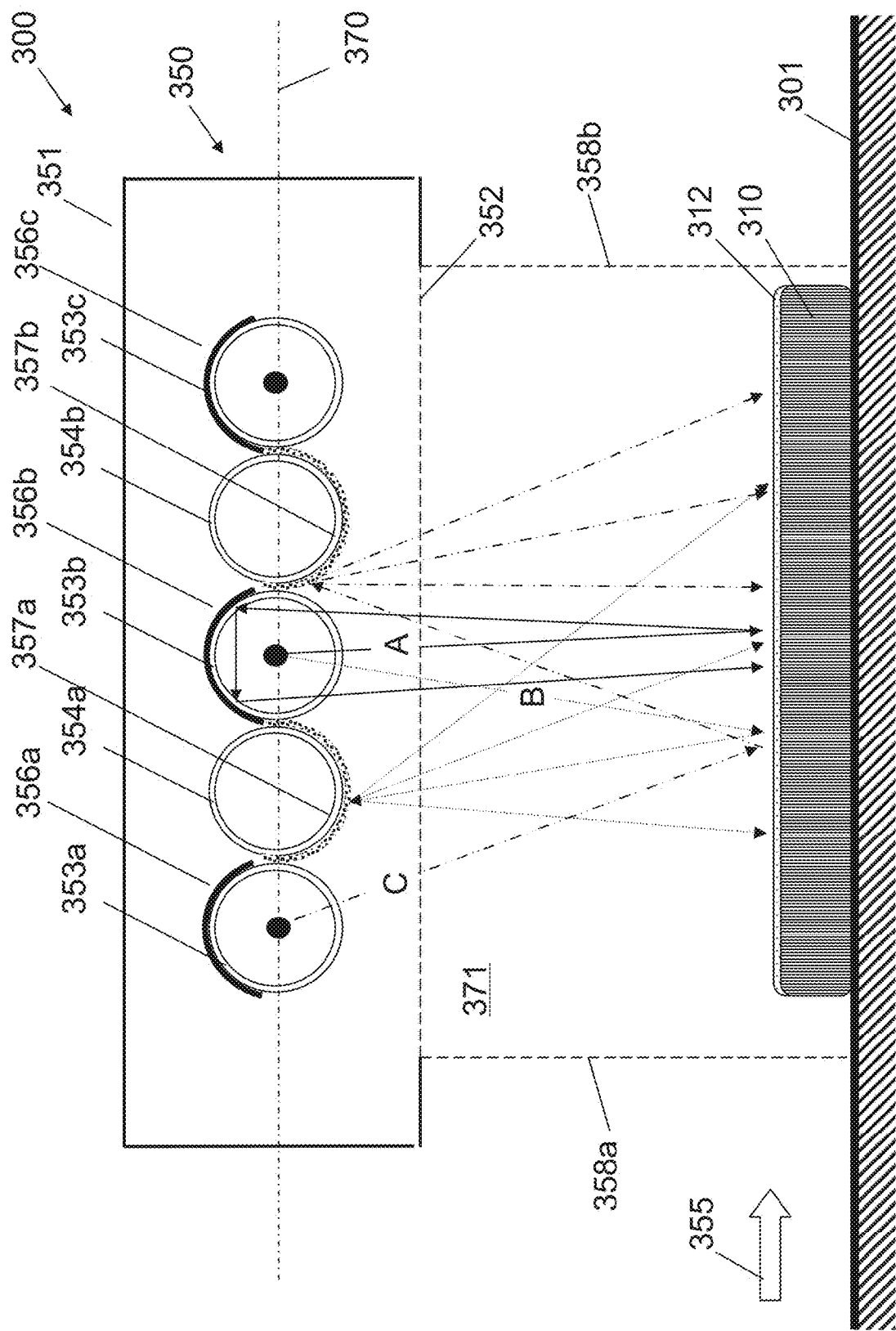
FIG. 3 is a cross-section of an irradiation apparatus including a radiator module according to another exemplary embodiment of the invention.

FIG. 3 shows a cross-section of an irradiation apparatus 300 including a third embodiment of a radiator module 350 according to the invention. The irradiation apparatus 300 is used for the drying of layers of paint on metallic surfaces.

The irradiation apparatus 300 includes a transport apparatus 301 for a substrate 310, and the radiator module 350. In this context, the transport apparatus 301 defines a transport direction 355 for the substrate 310. The substrate 310 has a reflective surface made of aluminium that is coated with a transparent layer of clear lacquer 312 that has not dried yet. The surface of the substrate 310 including layer of clear lacquer 312, taken together, reflect approximately 60% of the radiation that is incident on them.

The radiator module 350 includes a module housing 351 made of aluminium that is provided with an exit opening 352 for infrared radiation. Three structurally identical infrared radiators 353a, 353b, 353c and two structurally identical cladding tubes 354a, 354b are arranged appropriately in a radiator plane 370 within the module housing 351 such that the longitudinal axes of the infrared radiators and the longitudinal axes of the cladding tubes extend perpendicular to the transport direction 355.

The infrared radiators 353a, 353b, 353c are each characterized by a nominal power of 6,000 W at a nominal current of 15 A. The external diameter of each radiator tube is 34 mm, the radiator tube length is 1000 mm, and the wall thickness of each radiator tube is 2 mm.

Moreover, the radiator tubes each include a rear side facing away from the exit opening 352 and, disposed opposite from it, a front side facing the exit opening 352 and the process space 371. Each rear side of the radiator tubes has a radiator tube coating 356a, 356b, 356c made of gold applied to it.

Two structurally identical, cylinder-shaped cladding tubes 354a, 354b are arranged between the infrared radiators 353a, 353b, 353c and have dimensions that correspond to those of the radiator tubes of infrared radiators 353a, 353b, 353c (same external diameter, same length, same wall thickness). A diffusely reflective cladding tube coating 357a, 357b made of opaque quartz glass (QRC®, Heraeus) is applied to the rear side of each of the cladding tubes 354a, 354b.

Moreover, FIG. 3 shows, for exemplary purposes, the beam path of individual beams A, B, C that are emitted from the infrared radiators 353a, 353b, 353c. They are shown by different hatching in FIG. 3.

Emitted by the infrared radiator 353b, beam A is incident on the surface of the substrate 310 at a nearly perpendicular angle and is absorbed in part by the surface of the substrate 310, but is also reflected back, at least in part, in the direction of the reflector of the emitting infrared radiator, i.e. back to reflector 356b, and is reflected back there in multiple steps onto the substrate 310 and is available again for irradiation of the substrate 310.

If the radiation is incident on the substrate 310 (beam B) at a smaller angle, the reflected beam is not returned to the reflector of the emitting infrared radiator (here: 356b), but to a neighbouring cladding tube 354a, where it is incident on the cladding tube reflector 357a. The incident part-beam B is diffusely reflected in this place and, overall, reflected back onto the substrate 310.

If the radiation is incident on the substrate 310 at an even smaller angle (beam C), the reflected portion of the radiation is reflected back onto one of the reflectors, for example, onto the reflector of a further infrared lamp (not shown) or onto the reflector of a cladding tube that is not directly adjacent, for example, the reflector 357b of the cladding tube 354b (beam C). In both cases, the beam is reflected back in the direction of the substrate 310.

By this means, radiation reflected by the substrate can be guided back onto the substrate in a small number of reflection steps. At the same time, radiation losses are prevented. In addition, the arrangement according to this exemplary embodiment of the invention contributes to the beams being guided back into the process space 371 (shown by dashed lines 358a, 358b in FIG. 3) such that high irradiation intensity can be attained in this place.

A first reference example is now described. In as far as the same reference numbers are used in FIGS. 3 and 4; these denote components and parts that are structurally identical or equivalent as illustrated in more detail above by means of the description relating to FIG. 3.

Figure 4:
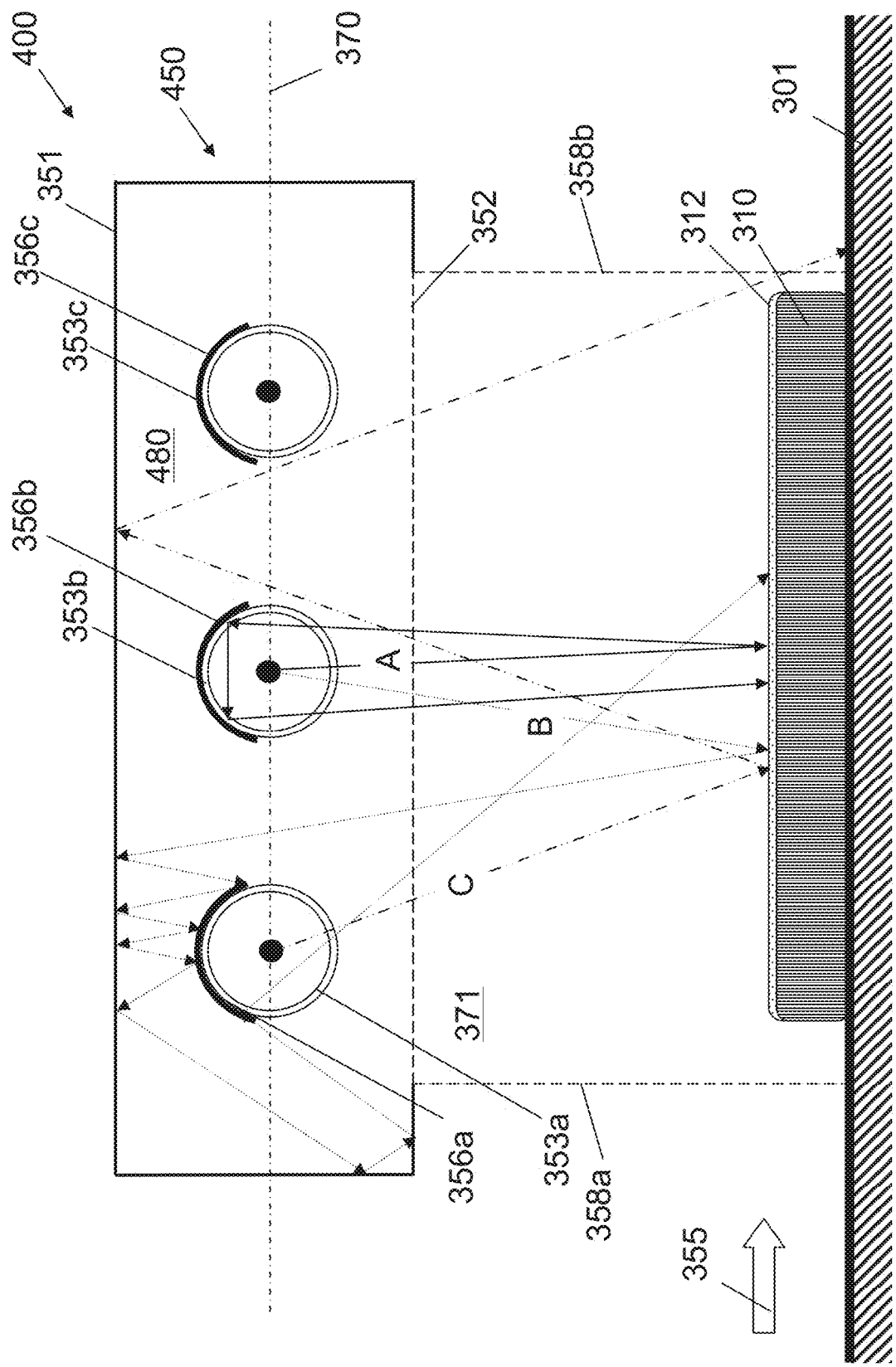
FIG. 4 is a cross-section of an irradiation apparatus including a radiator module according to yet another exemplary embodiment of the invention, without a cladding tube as a reference example.

FIG. 4 shows a cross-section of an irradiation apparatus 400 including a radiator module 450 that differs from the radiation apparatus 300 according to FIG. 3 essentially in that no cladding tube provided with a reflector coating 357a, 357b is arranged between the infrared radiators 353a, 353b, and 353c.

In addition, FIG. 4 shows the beam path of beams A, B, C that is shown in FIG. 3 for exemplary purposes.

Emitted by the infrared radiator 353b, beam A is incident on the surface of the substrate 310 at a nearly perpendicular angle and is absorbed in part by the surface of the substrate 310, but is also reflected back, at least in part, in the direction of the reflector of the emitting infrared radiator, i.e. back to the gold coating 356b, and is reflected back there in two steps onto the substrate 310; the reflected portion of beam A is available again for irradiation of the substrate 310.

The beam path of beam A from FIG. 4 does not differ from the one from FIG. 3. Differences in beam path are observed for beams B and C though.

Beam B is incident on the substrate 310 at a smaller angle as compared to beam A. The reflected portion of beam B therefore reaches the rear space 480 of the radiator module 450. Since the module housing 351 is manufactured from aluminium, beam B is reflected onto the rear-side surface of the gold coating 356a of the infrared radiator 353a. It is returned into the process space 371 only after multiple reflections on module housing 351 and the rear-side surface of the gold coating 356a.

However, just as well, the reflected portion of radiation is incident on the surface of the substrate at an angle such that the radiation is reflected into the process space and, from there, into an area outside of the process space (see beam C). Radiation reflected as described above is not available for an irradiation in the process space 371; a reduced irradiation intensity is attained.

A second reference example is now described. In order to demonstrate the influence of the cladding tubes on the radiation intensity, reference experiments using a substrate in the form of an aluminium sheet (L×W×H 400 mm×400 mm×1.3 mm) were carried out.

For this purpose, the top side of the aluminium sheet was heated with a radiator module from a starting temperature of 25° C. to a target temperature of 270° C., and the temperature of the aluminium sheet was detected as a function of the heating time by means of a thermocouple that was attached to the rear side of the aluminium sheet.

The radiator module includes nine twin-tube infrared radiators arranged parallel to each other, each with a radiator tube length of 700 millimeters and a cross-section of 23 mm×11 mm. The nominal operating power of the radiator module is 9×4200 W. The distance between the middle axis of a first infrared radiator and the middle axis of a neighbouring second infrared radiator is 55 mm.

Two variants of the radiator module were used: in Variant 1, eight cladding tubes with a half-site coating made of opaque quartz glass are inserted between the radiator tubes, with a cladding tube cross-section of 23 mm×11 mm, and cladding tube length of 700 mm; in Variant 2, there were no cladding tubes.

The results are shown below. As shown in the results, the use of additional cladding tubes increases the heating efficiency by approximately 27%.

|  | Variant 1 | Variant 2 |
| --- | --- | --- |
| Heating time: | 58 s | 79 s |
| Mean heating gradient: | 3.1 K/s | 4.0 K/s |

Although the invention is illustrated and described herein with reference to specific embodiments, the invention is not intended to be limited to the details shown. Rather, various modifications may be made in the details within the scope and range of equivalents of the claims and without departing from the invention.

The invention claimed is:

1. A radiator module comprising:
   a first infrared radiator including a first radiator tube arranged in a radiator plane;

a second infrared radiator including a second radiator tube arranged in the radiator plane; and a cladding tube arranged between the first radiator tube and the second radiator tube, wherein the first radiator tube, the second radiator tube, and the cladding tube each are provided with a reflective coating.

2. The radiator module of to claim 1, wherein the cladding tube is provided with a diffusely scattering coating.

3. The radiator module of claim 1 wherein at least one of the first radiator tube and the second radiator tube is provided with a directed-reflective coating.

4. The radiator module claim 1 wherein the reflective coating of at least one of the first radiator tube, the second radiator tube and the cladding tube is manufactured from gold, opaque quartz glass or ceramics.

5. The radiator module of claim 1 wherein the first radiator tube and the second radiator tube are provided with a reflective coating made of gold and the cladding tube is provided with a coating made of opaque quartz glass.

6. The radiator module of claim 1 wherein the reflective coating of at least one of the first radiator tube, the second radiator tube and the cladding tube is applied to a circumferential section of a corresponding outer jacket of the at least one of the first radiator tube, the second radiator tube and cladding tube.

7. The radiator module of claim 1 wherein each of the first radiator tube, the second radiator tube, and the cladding tube include a side that faces a process space and a side that faces away from the process space, wherein the reflective coating is applied to the side of the first radiator tube and the second radiator tube that faces away from the process space and to the side of the cladding tube that faces the process space.

8. A radiator module of claim 1 wherein the cladding tube includes an external jacket, wherein a section of the external jacket of the cladding tube is fully jacketed by the reflective coating.

9. A radiator module of claim 1 wherein the reflective coatings of the first radiator tube, the second radiator tube, and the cladding tube are connected to each other.

10. A radiator module of claim 1 wherein a shortest distance between at least one of (i) the first radiator tube and the cladding tube and (ii) the second radiator tube and the cladding tube is in the range of 0.5 mm to 2 mm.

11. A method of using a radiator module comprising the steps of:

(a) providing a radiator module including (i) a first infrared radiator including a first radiator tube arranged in a radiator plane, (ii) a second infrared radiator including a second radiator tube arranged in a radiator plane, and (iii) a cladding tube arranged between the first radiator tube and the second radiator tube, wherein the first radiator tube, the second radiator tube, and the cladding tube each are provided with a reflective coating; and (b) heating, using the radiator module, at least one of a metal sheet, a substrate for printed electronics, and ink.

12. The radiator module of claim 2 wherein at least one of the first radiator tube and the second radiator tube is provided with a directed-reflective coating.

13. The radiator module of claim 2 wherein the reflective coating of at least one of the first radiator tube, the second radiator tube and the cladding tube is manufactured from gold, opaque quartz glass or ceramics.

14. The radiator module of claim 3 wherein the reflective coating of at least one of the first radiator tube, the second radiator tube and the cladding tube is manufactured from gold, opaque quartz glass or ceramics.

15. The radiator module of claim 2 wherein the first radiator tube and the second radiator tube are provided with a reflective coating made of gold and the cladding tube is provided with a coating made of opaque quartz glass.

16. The radiator module of claim 3 wherein the first radiator tube and the second radiator tube are provided with a reflective coating made of gold and the cladding tube is provided with a coating made of opaque quartz glass.

17. The radiator module of claim 4 wherein the first radiator tube and the second radiator tube are provided with a reflective coating made of gold and the cladding tube is provided with a coating made of opaque quartz glass.

18. The radiator module of claim 2 wherein the reflective coating of at least one of the first radiator tube, the second radiator tube and the cladding tube is applied to a circumferential section of a corresponding outer jacket of the at least one of the first radiator tube, the second radiator tube and the cladding tube.

19. The radiator module of claim 3 wherein the reflective coating of at least one of the first radiator tube, the second radiator tube and the cladding tube is applied to a circumferential section of a corresponding outer jacket of the at least one of the first radiator tube, the second radiator tube and the cladding tube.

20. The radiator module of claim 4 wherein the reflective coating of at least one of the first radiator tube, the second radiator tube and the cladding tube is applied to a circumferential section of a corresponding outer jacket of the at least one of the first radiator tube, the second radiator tube and the cladding tube.

* * * * *